(12) United States Patent
Fruehling et al.

(10) Patent No.: US 10,775,422 B2
(45) Date of Patent: Sep. 15, 2020

(54) MOLECULAR SPECTROSCOPY CELL WITH RESONANT CAVITY

(71) Applicant: TEXAS INSTRUMENTS INCORPORATED, Dallas, TX (US)

(72) Inventors: Adam Joseph Fruehling, Garland, TX (US); Juan Alejandro Herbsommer, Allen, TX (US); Benjamin Stassen Cook, Addison, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/695,651

(22) Filed: Sep. 5, 2017

(65) Prior Publication Data

US 2019/0072595 A1 Mar. 7, 2019

(51) Int. Cl.
*G01N 22/00* (2006.01)
*G01R 23/16* (2006.01)
*H03L 7/26* (2006.01)
*H01P 7/06* (2006.01)

(52) U.S. Cl.
CPC ............ *G01R 23/16* (2013.01); *G01N 22/00* (2013.01); *H03L 7/26* (2013.01); *H01P 7/06* (2013.01)

(58) Field of Classification Search
None
See application file for complete search history.

(56) References Cited

U.S. PATENT DOCUMENTS

| 4,147,431 A | 4/1979 | Mann |
| 4,826,616 A | 5/1989 | Tanino |
| 5,107,231 A | 4/1992 | Knox |
| 5,198,786 A | 3/1993 | Russell et al. |
| 5,218,373 A * | 6/1993 | Heckaman ............. H01Q 1/405 333/246 |
| 5,412,186 A * | 5/1995 | Gale ..................... B81C 1/0096 219/679 |
| 5,459,324 A | 10/1995 | Fima |
| 5,821,836 A * | 10/1998 | Katehi .................. H01P 1/2088 333/202 |
| 6,131,256 A | 10/2000 | Dydyk et al. |
| 6,236,366 B1 | 5/2001 | Yamamoto et al. |

(Continued)

FOREIGN PATENT DOCUMENTS

| JP | 6428974 | 1/1989 |
| WO | WO2014037016 | 3/2014 |
| WO | 2016161215 | 10/2016 |

OTHER PUBLICATIONS

International Search Report for PCT/US2018/050253 dated Jan. 10, 2019.

(Continued)

*Primary Examiner* — Nasima Monsur
(74) *Attorney, Agent, or Firm* — Michael A. Davis, Jr.; Charles A. Brill; Frank D. Cimino

(57) ABSTRACT

A device includes a substrate that includes a resonant cavity. The resonant cavity includes a plurality of dipolar molecules that have an absorption frequency. The resonant cavity resonates at a frequency that is equal to the absorption frequency of the dipolar molecules. The device further includes a first port on the resonant cavity configured to receive a radio frequency (RF) signal.

8 Claims, 4 Drawing Sheets

(56) References Cited

U.S. PATENT DOCUMENTS

| | | | |
|---|---|---|---|
| 6,287,874 B1* | 9/2001 | Hefti | H01J 49/04 |
| | | | 436/149 |
| 6,362,706 B1 | 3/2002 | Song et al. | |
| 6,498,550 B1 | 12/2002 | Miller et al. | |
| 6,630,359 B1 | 10/2003 | Caillat et al. | |
| 6,670,866 B2 | 12/2003 | Ella et al. | |
| 6,842,088 B2 | 1/2005 | Yamada et al. | |
| 6,989,723 B2 | 1/2006 | Komuro et al. | |
| 6,998,691 B2 | 2/2006 | Baugh | |
| 7,388,454 B2 | 6/2008 | Ruby et al. | |
| 7,408,428 B2 | 8/2008 | Larson, III | |
| 8,098,208 B2 | 1/2012 | Ficker et al. | |
| 8,268,642 B2 | 9/2012 | Yoshitomi et al. | |
| 8,293,661 B2 | 10/2012 | Yamazaki | |
| 8,586,178 B2 | 11/2013 | Schwanke et al. | |
| 9,436,902 B1 | 9/2016 | Koepp et al. | |
| 9,529,334 B2 | 12/2016 | Herbsommer et al. | |
| 9,735,754 B2 | 8/2017 | Shin et al. | |
| 2002/0038989 A1 | 4/2002 | Larson, III | |
| 2002/0068018 A1* | 6/2002 | Pepper | G01N 21/7746 |
| | | | 422/82.05 |
| 2002/0098611 A1 | 7/2002 | Chang et al. | |
| 2003/0015707 A1 | 1/2003 | Bosco et al. | |
| 2003/0048500 A1 | 3/2003 | Fala et al. | |
| 2003/0107459 A1 | 6/2003 | Takahashi et al. | |
| 2004/0142484 A1* | 7/2004 | Berlin | G01N 21/65 |
| | | | 436/171 |
| 2004/0166577 A1 | 8/2004 | Storek et al. | |
| 2005/0023932 A1 | 2/2005 | Inoue et al. | |
| 2006/0022761 A1 | 2/2006 | Abeles | |
| 2006/0076632 A1 | 4/2006 | Palmateer et al. | |
| 2006/0144150 A1 | 7/2006 | Wu | |
| 2007/0189359 A1 | 8/2007 | Chen et al. | |
| 2008/0319285 A1* | 12/2008 | Hancock | A61B 5/05 |
| | | | 600/309 |
| 2010/0182102 A1 | 7/2010 | Kuypers et al. | |
| 2010/0259334 A1 | 10/2010 | Briggs | |
| 2010/0327701 A1 | 12/2010 | Grannen et al. | |
| 2011/0140971 A1 | 6/2011 | Schwanke et al. | |
| 2012/0266681 A1 | 10/2012 | Baumann et al. | |
| 2013/0176703 A1 | 7/2013 | Hopper et al. | |
| 2014/0155295 A1 | 6/2014 | Hindson et al. | |
| 2014/0210835 A1 | 7/2014 | Hong et al. | |
| 2014/0347074 A1 | 11/2014 | Nadeau | |
| 2014/0368376 A1 | 12/2014 | Nadeau et al. | |
| 2014/0368377 A1 | 12/2014 | Nadeau et al. | |
| 2014/0373599 A1 | 12/2014 | Trombley et al. | |
| 2015/0144297 A1 | 5/2015 | Toivonen et al. | |
| 2015/0123748 A1 | 7/2015 | Stevenson | |
| 2015/0277386 A1 | 10/2015 | Passilly et al. | |
| 2016/0091663 A1 | 3/2016 | Taylor | |
| 2016/0233178 A1 | 8/2016 | Lamy et al. | |
| 2017/0073223 A1 | 3/2017 | Nasiri et al. | |
| 2017/0125660 A1 | 5/2017 | Stephanou et al. | |
| 2017/0130102 A1 | 5/2017 | Campbell et al. | |
| 2018/0159547 A1 | 6/2018 | Herbsommer et al. | |

OTHER PUBLICATIONS

Alvarez, A.L. et al; "The Application of Microencapsulation Techniques in the Treatment of Endodontic and Periodontal Diseases" Pharmaceutics; 2011 abstract p. 540-548.

Steinberg, D. et al; "A New Degradable Controlled Release Device for Treatment of Periodontal Disease: In Vitro Release Study"; J. Periodontology; 1990; p. 393 lines 1-17; p. 394 col. 1 lines 5-14.

Xiong, R. et al.; "Towards Theranostic Multicompartment Microcapsules: in situ Diagnostics and Laser-induced Treatment", Theranostics; 2013; pp. 145-149.

International Search Report for PCT/US2018/049513 dated Nov. 15, 2018.

International Search Report for PCT/US2018/049940 dated Dec. 13, 2018.

International Search Report for PCT/US2018/049949 dated Dec. 13, 2018.

International Search Report for PCT/US2018/049949 dated Dec. 27, 2018.

International Search Report for PCT/US2018/047105 dated Dec. 27, 2018.

* cited by examiner

MOLECULAR SPECTROSCOPY CELL WITH RESONANT CAVITY

BACKGROUND

Various applications may include a sealed chamber formed in a semiconductor structure. In one particular application, a chip-scale atomic dock may include a selected vapor at a low pressure in a sealed chamber. Miniaturization of such devices while maximizing the cross-sectional area of interaction with the molecules in the chamber is a challenge.

SUMMARY

In one embodiment, a device includes a substrate that includes a resonant cavity. The resonant cavity includes a plurality of dipolar molecules that have an absorption frequency. The resonant cavity resonates at a frequency that is equal to the absorption frequency of the dipolar molecules. The device further includes a first port on the resonant cavity configured to receive a radio frequency (RF) signal.

A device includes a substrate that includes a resonant cavity. The resonant cavity includes a plurality of dipolar molecules that have an absorption frequency. The resonant cavity resonates at a frequency that is equal to the absorption frequency of the dipolar molecules. The device further includes a first port on the resonant cavity configured to receive a radio frequency (RF) signal. Further, the device includes a transceiver coupled to the first port to lock the frequency of the RF signal to the absorption frequency.

In yet another embodiment, a device includes a substrate that includes a resonant cavity. The resonant cavity includes a plurality of water molecules that have an absorption frequency. The resonant cavity resonates at a frequency that is equal to the absorption frequency of the water molecules. A first port is provided on the resonant cavity and is configured to receive a radio frequency (RF) signal. A signal generator is coupled to the first port and os configured to generate the RF signal. A power monitor is coupled to the first port to detect reflected power from the port.

BRIEF DESCRIPTION OF THE DRAWINGS

For a detailed description of various examples, reference will now be made to the accompanying drawings in which.

DETAILED DESCRIPTION

The embodiments disclosed herein are directed to a spectroscopy cell which comprises a cavity formed in a substrate such as a semiconductor substrate. The cavity contains a species of a dipolar molecule (e.g., water molecules) at a relatively low pressure. The cavity is hermetically sealed and a radio frequency (RF) signal is injected into the cavity at a frequency that approximately equals the absorption frequency of the dipolar molecules in the cavity. For water molecules, the absorption frequency is 183.31 GHz. The disclosure spectroscopy cell can be used for a variety of applications such as a clock generator to produce a clock signal at 183.31 GHz that does not vary with temperature, pressure, or process.

The pressure inside the cavity is relatively low. In the example of water molecules, the pressure may be approximately 0.1 millibars (mbars), although there is a range of acceptable pressures. If argon molecules were used, for example, the pressure may be several atmospheres. Pressures that are too high result in an increased width of the absorption peaks with respect to frequency and thus difficulty in locating the local minimum at the absorption frequency. Pressures that are too low results in so few molecules in the cavity that the signal amplitude is too small and thus the high signal-to-noise ratio is too high. In general, it is desirable to have as many molecules in the cavity to provide an acceptable signal amplitude but not so many molecules for a given size cavity that the pressure is too high for successful identification of the absorption peak.

In the disclosed embodiments, the cavity in the spectroscopy cell is a resonant cavity. As a resonant cavity, an RF signal injected into the cavity at the resonant frequency of the cavity cause the electromagnetic waves to reinforce. The quality (Q) factor of a resonant cavity can be relatively high, which increases the stability of the spectroscopy cell. In one embodiment, a spectroscopy cell is made from a semiconductor substrate that is processed to form the resonant cavity.

FIGS. 1A-E illustrate a series of steps to fabricate a spectroscopy cell. At FIG. 1A, a first oxide layer 102 is formed on a first substrate 100. A first metal layer 104 is formed on a surface of the first oxide layer 102 opposite the first substrate 100. The first metal layer 104 may comprise copper or another suitable metal. A second oxide layer 106 is formed on a surface of the first metal layer 104 opposite the first oxide layer 102. The oxide layers may comprise silicon oxide and layers 102-106 may be formed in accordance with any suitable semiconductor process operations. The substrate 100 is a semiconductor substrate (e.g., silicon) in some embodiments, but can be other than a semiconductor substrate in other embodiments, such as a ceramic or dielectric (e.g., glass) material or a three-dimensional (3D) machined metallic cavity.

Figure 1A:
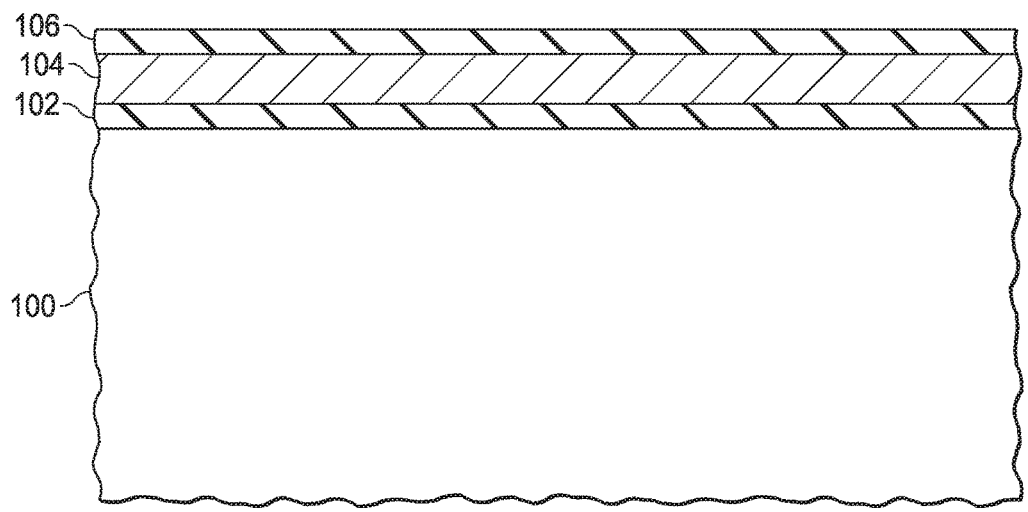
FIGS. 1A-E illustrate a sequence of operations to form a resonant cavity for a spectroscopy cell.
Figure 1B:
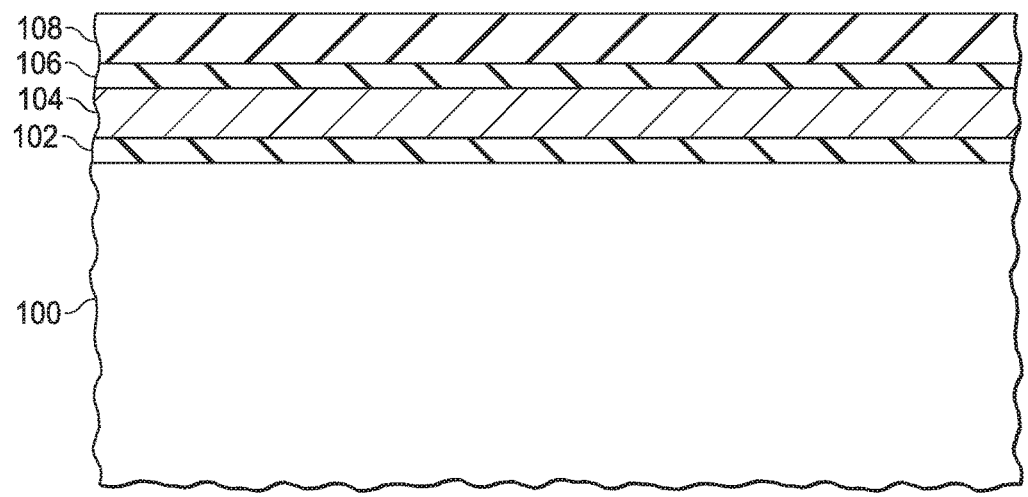

At FIG. 1B, a non-conductive structure 108 is bonded (or deposited) to a surface of the second oxide layer 106 opposite the first metal layer 104. In one example, the non-conductive structure comprises glass (e.g., 130 micrometers thick), but can include other dielectric materials such as ceramics or polymers in other embodiments. The process to bond the non-conductive structure 108 to the second oxide layer 106 may comprise an anodic, fusion, eutectic solder, transition liquid phase (TLP), cofiring, or other suitable bonding processes. In some embodiments, non-conductive structure 108 may be bonded directly to first metal layer 104 without the need of the second oxide layer 106.

Figure 1C:
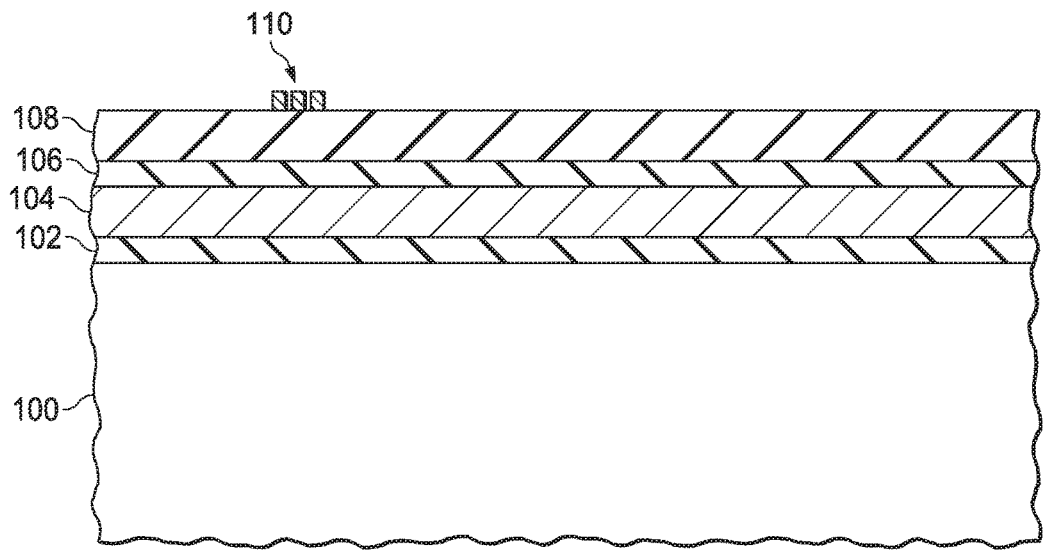

FIG. 1C illustrates that an antenna 110 has been patterned on a surface of the non-conductive structure 108. The antenna 110 comprises a conductive material such as copper or gold and an electrical RF signal can be provided to the antenna. In some embodiments, the resonant cavity is a single-port cavity having antenna 110, but in other embodiments, the resonant cavity includes multiple ports with one antenna for each port. For a multi-port cavity, one port is used to inject an RF signal into the resonant cavity, and the other port is used to monitor the signal from the cavity. FIG. 1F illustrates an example of a multi-port cavity with antennas 110a and 110b.

Figure 1D:
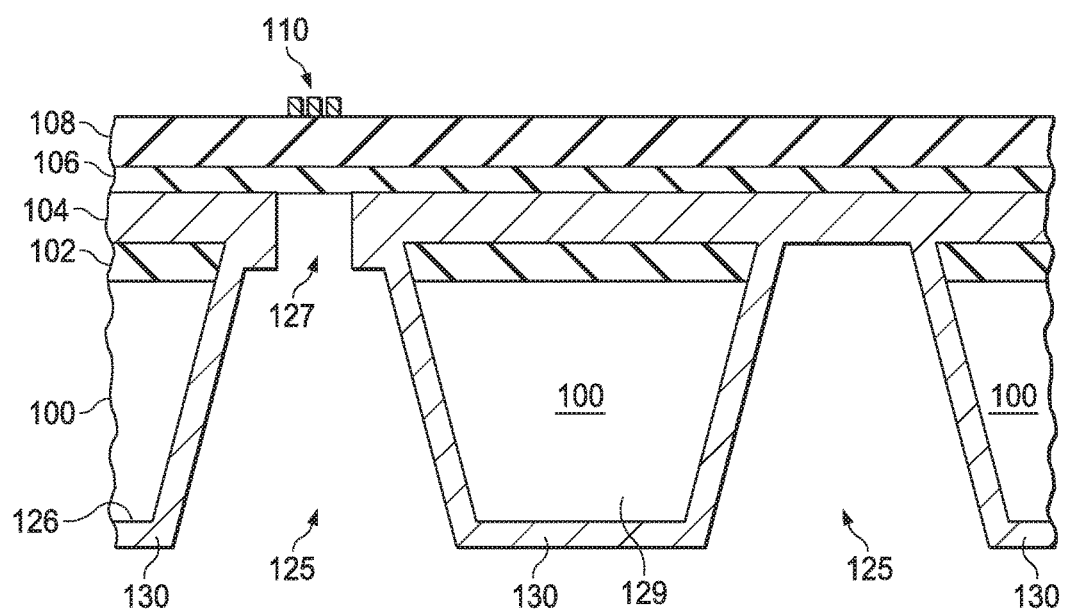

FIG. 1D illustrates that a cavity 125 has been created in the substrate 100. The cavity 125 may be wet etched into the substrate 120 using a suitable wet etchant such as potassium hydroxide (KOH) or tetramethylammonium hydroxide (TMAH). The cavity 125 is etched from the surface 126 of the substrate 100 opposite the first oxide layer 102 to the first oxide layer 102, thereby exposing a portion of the first oxide layer 102. The cavity may be formed in a circular, square, rectangular or other cross-sectional shape. In the embodiment of FIG. 1D, the cavity is formed around a center post 129 such that the post occupies a portion of the center of the cavity 125. The post 129 is a portion of the substrate 100 that was not etched away when forming the cavity 125. The central frequency of the cavity can be tuned through selection of the post dimensions. In one example, an unloaded (no post) 4 mm diameter by 0.5 mm tall octagonal cavity provides a resonant frequency of approximately 60 GHz. With the introduction of a central post having a base diameter of 1.75 mm, and sidewall profile tapered in accordance with the etched crystal planes, the resonant frequency can be reduced to approximately 6 GHz with a gap between the conductive surface (metal layer 130, discussed below) on the post 129 and the conductive surface (metal layer 142, discussed below) on the substrate 140 of 3.5 micron. Any intermediate frequency is achievable by design of the post gap between a few microns and the full cavity depth and can be further tuned with the post diameter. In addition, this can increase the maximum electric field strength in the region of the post by orders of magnitude. In other embodiments, the cavity 125 does not include a central post. The cavity 125 in FIG. 1D also illustrates that another metal layer 130 has been deposited on a surface of the substrate 100 opposite the first oxide layer 102. The metal layer 130 is deposited in the cavity 125 as shown and in some examples may be sputter deposited (e.g. 40 nm Ti or Cr and 1 um of Cu or Au)

Referring still to FIG. 1D, an iris 127 is formed in the metal layer 130 generally adjacent the antenna 110. The iris 127 is patterned in the metal layer 130 and exposes at least a portion of the second oxide layer 106. The iris 140 permits the RF energy from the incident radio frequency (RF) signal provided by the antenna 110 is able to penetrate through the iris 127 and into the cavity 125.

Figure 1E:
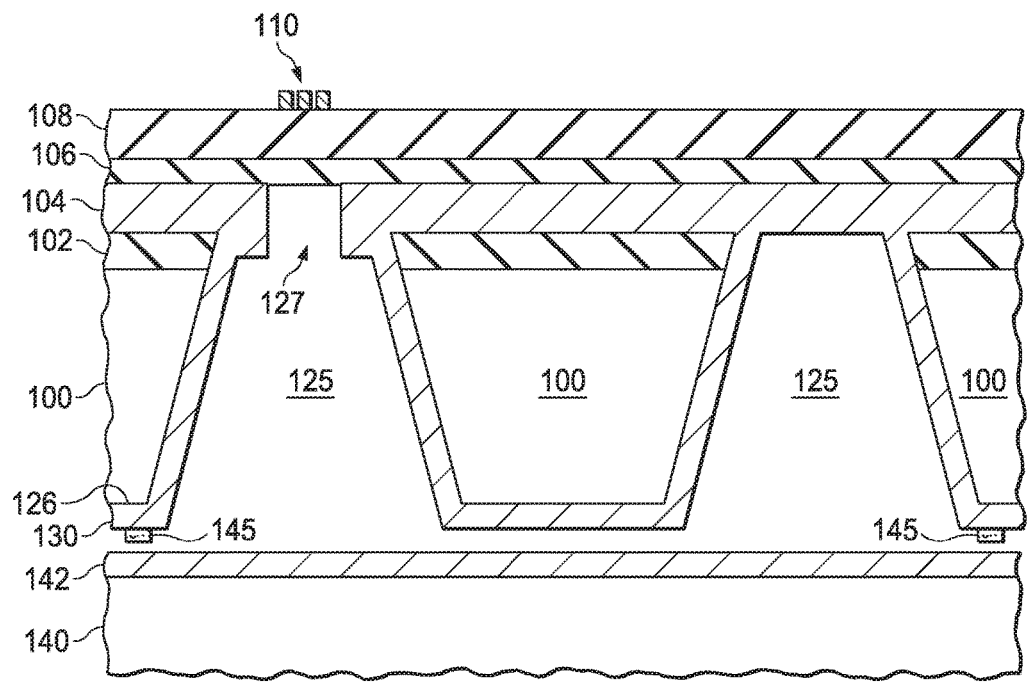
Figure 1F:
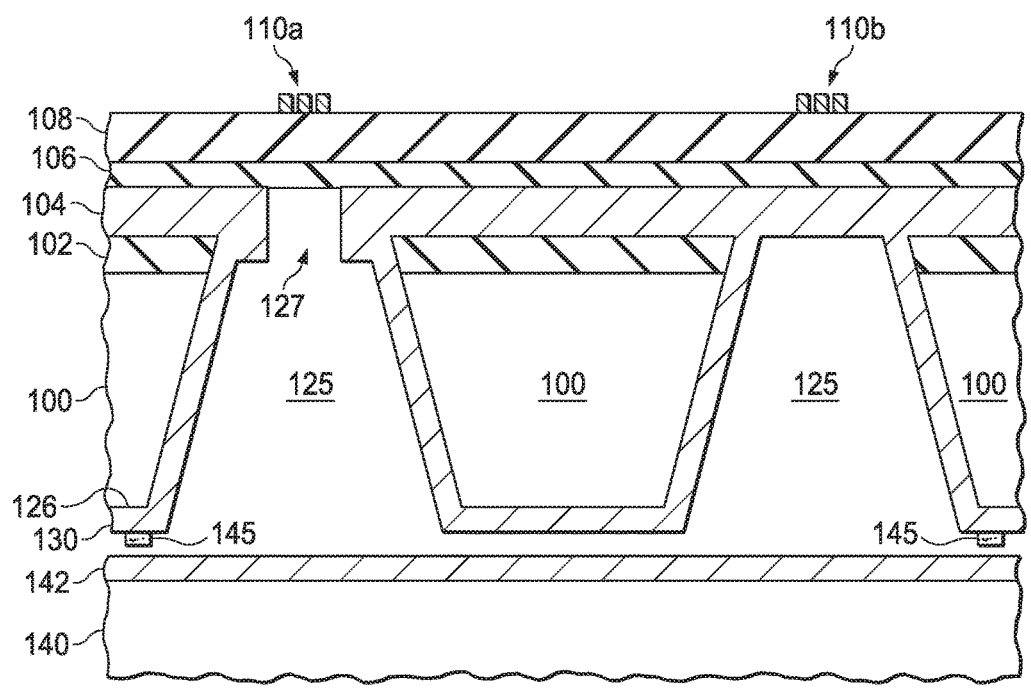
FIG. 1F shows an example of a multi-port resonant cavity.

FIG. 1E shows a second substrate 140 and a metal layer 142 formed thereon. The substrate 140 may comprise the same or different material as substrate 100. In one example, the substrate 140 comprises a semiconductor substrate such as a portion of a silicon wafer, but can be other than a semiconductor material in other examples (e.g. ceramic, kovar/invar, or other 3D manufactured metal structures). Bonding structures 145 are deposited and patterned on either or both of the substrates 100 and 140. In one example, the bonding structures comprise a gold, aluminum, silicon or other types of material that form an alloy when heated to a suitable temperature. The resulting structure includes a hermetically sealed resonator cavity. Dipolar molecules (e.g., water molecules) may be trapped inside the cavity 125 and at an internal pressure of approximately 0.1 mbars, although there can be a range of pressure in various applications.

Figure 1G:
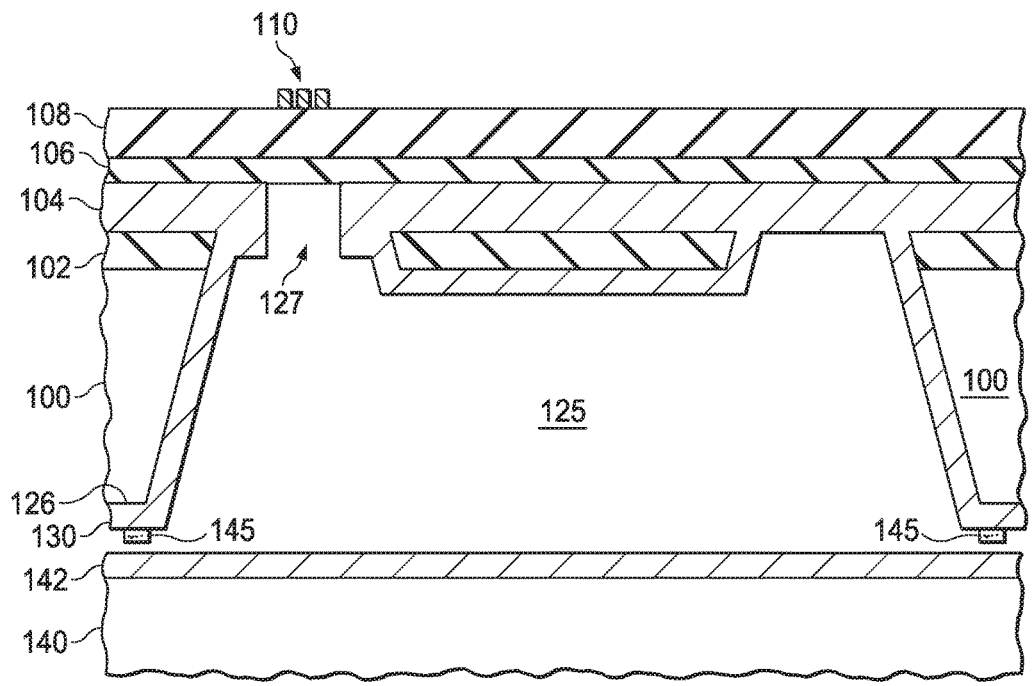
FIG. 1G shows an example of a resonant cavity without a central post.

Some embodiments do not include the center post in the cavity. FIG. 1G shows an example of a resonant cavity without the center post.

The shape and size of the cavity 125 can vary between embodiments. In general, the cavity is sized to resonate at a particular frequency, or range of frequencies. The size of the cavity scales with the frequency. To achieve resonant frequencies in the sub-10 GHz range, the cavity will grow quite large (on the order of cm). As demonstrated above, this dimension can be dramatically reduced with post loading. For example, an octagonal cavity etched in silicon resonating near 180 GHz would have a diameter of approximately 2.75 mm on the top of the cavity & 2.2 mm at the bottom. However, mode selection and excitation structures play a significant role in the sizing of the cavity. The resonant frequency of the cavity 125 includes the absorption frequency of the particular dipolar molecule species trapped inside the cavity (e.g., 183.31 GHz for water molecules).

Figure 2:
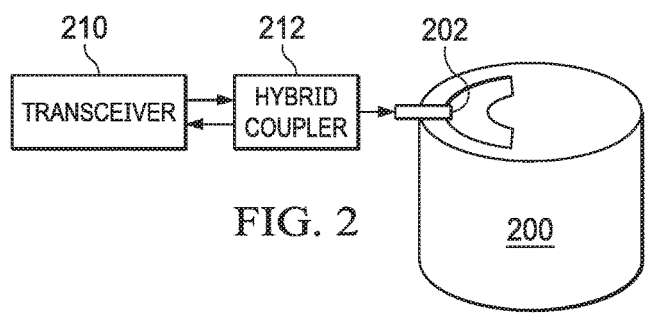
FIG. 2 shows an example of a single port resonant cavity coupled to a transceiver through a hybrid coupler in accordance with various embodiments.

As noted above, the spectroscopy cell includes a resonant cavity that has either only one port or multiple ports. FIG. 2 illustrates an embodiment of a single port resonant cavity 200. The resonant cavity 200 includes a port 202. Port 202 is coupled to a transceiver 210 through a hybrid coupler 212. The transceiver 210, which includes a signal generator and a power monitor, generates an RF signal at frequency that is approximately equal to the absorption frequency of the dipolar molecules in the cavity 200. The hybrid coupler 212 provides the RF signal to the port 202 on the cavity and receives reflected signals from the cavity as well. The transceiver 210 receives a signal indicative of the reflected signals and computes the reflected power from the port, which is indicative of how close the RF signal generated by the transceiver is to the absorption frequency of the molecule species in the cavity. The closer the RF frequency is to the absorption frequency, the lower will be reflected power from the cavity. The transceiver 210 uses the magnitude of the reflected power as a feedback signal to lock on to the absorption frequency of the molecules in the cavity.

Figure 3:
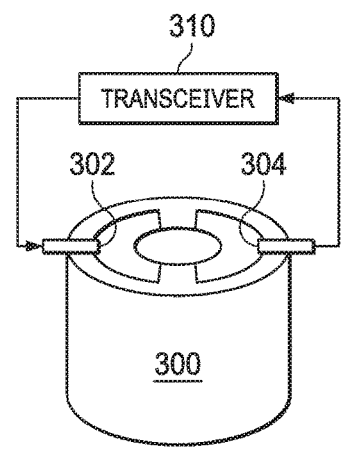
FIG. 3 shows an example of a multi-port resonant cavity coupled to a transceiver in accordance with various embodiments

FIG. 3 illustrates a two-port resonant cavity 300. The cavity includes a first port 302 and a second port 304. A transceiver 310 (which includes a signal generator) is connected to both ports 302 and 304. The transceiver 310 generates an RF signal and injects the RF signal into the resonant cavity through port 302. The transceiver 310 monitors the signal from port 304. The transceiver can sweep the frequency of the RF signal about the frequency known to be the absorption frequency of the cavity's dipolar molecules. At the absorption peak, the magnitude of the output signal (e.g., voltage) from the second port 304 is a minimum voltage compared to the output signal at other frequencies. The transceiver 310 uses the signal from port 304 to maintain a lock on the absorption frequency of the dipolar molecule species in the resonant cavity.

Certain terms are used throughout the above description and claims to refer to particular system components. As one skilled in the art will appreciate, different parties may refer to a component by different names. This document does not intend to distinguish between components that differ in name but not function. In the above discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device, comprising:
   a sealing structure:
   a substrate attached to the sealing structure, the substrate having a cavity sealed by the sealing structure, the cavity including dipolar molecules that have an absorption frequency, and the cavity configured to resonate at the absorption frequency;
   a port on the substrate or the sealing structure, the port configured to receive a radio frequency (RF) signal;
   a transceiver; and
   a hybrid coupler coupled between the transceiver and the port, the transceiver coupled through the hybrid coupler to the port, and the hybrid coupler configured to provide the RF signal from the transceiver to the port, and to provide a reflected signal from the port to the transceiver, and the transceiver configured to lock a frequency of the RF signal to the absorption frequency.

2. The device of claim 1, wherein the transceiver is configured to adjust the frequency of the RF signal based on a power of the reflected signal.

3. The device of claim 1, wherein the port is a first port, and the device further comprises a second port on the substrate or the sealing structure.

4. The device of claim 3, wherein the transceiver is configured to provide the RF signal to the first port, and to adjust the frequency of the RF signal based on a signal received by the transceiver from the second port.

5. The device of claim 1, wherein the substrate is a semiconductor substrate, and the cavity has walls that are lined with a metal.

6. The device of claim 1, wherein the cavity includes a post at a center of a surface of the cavity.

7. The device of claim 1, wherein the dipolar molecules include water molecules.

8. The device of claim 1, wherein the cavity is hermetically sealed by the sealing structure.

* * * * *